United States Patent
Ogawa et al.

(10) Patent No.: US 10,080,282 B2
(45) Date of Patent: Sep. 18, 2018

(54) FLEXIBLE PRINTED CIRCUIT AND ELECTRONIC APPARATUS

(71) Applicants: KABUSHIKI KAISHA TOSHIBA, Minato-ku, Tokyo (JP); Toshiba Client Solutions CO., LTD., Koto-ku, Tokyo (JP)

(72) Inventors: Hideki Ogawa, Hino Tokyo (JP); Sasaki Kazuyoshi, Ome Tokyo (JP)

(73) Assignees: Kabushiki Kaisha Toshiba (JP); Toshiba Client Solutions Co., Ltd. (JP)

( * ) Notice: Subject to any disclaimer, the term of this patent is extended or adjusted under 35 U.S.C. 154(b) by 0 days.

(21) Appl. No.: 15/433,933

(22) Filed: Feb. 15, 2017

(65) Prior Publication Data

US 2017/0238414 A1 Aug. 17, 2017

Related U.S. Application Data

(60) Provisional application No. 62/296,003, filed on Feb. 16, 2016.

(51) Int. Cl.
*H05K 1/02* (2006.01)
*G06F 1/16* (2006.01)

(52) U.S. Cl.
CPC ......... *H05K 1/0281* (2013.01); *G06F 1/1658* (2013.01); *H05K 2201/05* (2013.01)

(58) Field of Classification Search
CPC .................................. H05K 1/189; H05K 7/00
USPC .......................................................... 361/749
See application file for complete search history.

(56) References Cited

U.S. PATENT DOCUMENTS

| | | | | |
|---|---|---|---|---|
| 6,256,877 B1* | 7/2001 | Hacke | ............... | H01L 23/49816 174/254 |
| 7,212,413 B2* | 5/2007 | Chang | ................. | G02F 1/13452 174/254 |
| 8,912,454 B2* | 12/2014 | Sasaki | ................. | H04M 1/0235 174/50.5 |
| 8,973,258 B2* | 3/2015 | Chen | ....................... | H05K 3/244 257/E23.169 |
| 2001/0040793 A1* | 11/2001 | Inaba | .................. | H01L 23/5387 361/749 |
| 2006/0268530 A1* | 11/2006 | Nagao | ..................... | H05K 1/028 361/749 |
| 2015/0036300 A1* | 2/2015 | Park | ....................... | H05K 1/147 361/749 |
| 2015/0098196 A1* | 4/2015 | Palmer | ................... | H05K 3/284 361/749 |
| 2015/0163939 A1* | 6/2015 | Park | ..................... | G02F 1/13452 361/749 |

FOREIGN PATENT DOCUMENTS

| | | |
|---|---|---|
| JP | 64-043558 U1 | 3/1989 |
| JP | 05-048238 A | 2/1993 |
| JP | 09-097954 A | 4/1997 |
| JP | 2009-218449 A | 9/2009 |
| WO | 2015/050111 A1 | 4/2015 |

* cited by examiner

*Primary Examiner* — Hoa C Nguyen
*Assistant Examiner* — Stanley Tso
(74) *Attorney, Agent, or Firm* — Rutan & Tucker, LLP

(57) ABSTRACT

According to one embodiment, FPC has a flexible board body, a reinforcing plate, an opening portion, and a bent structure. The opening portion is formed to penetrate through the board body. The bent structure is bent to pass through the inside of the opening portion.

10 Claims, 5 Drawing Sheets

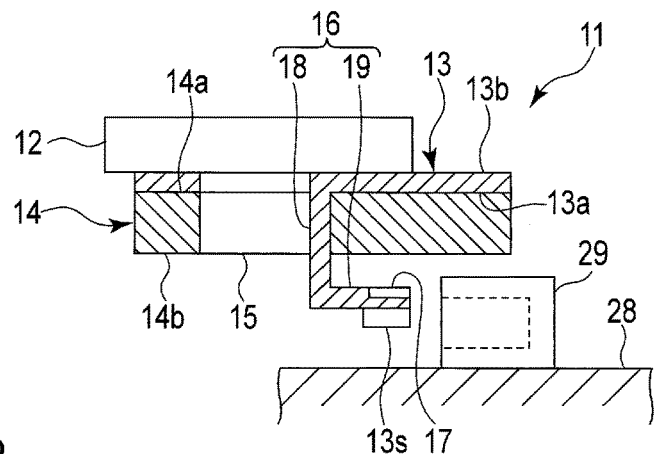
F I G. 8
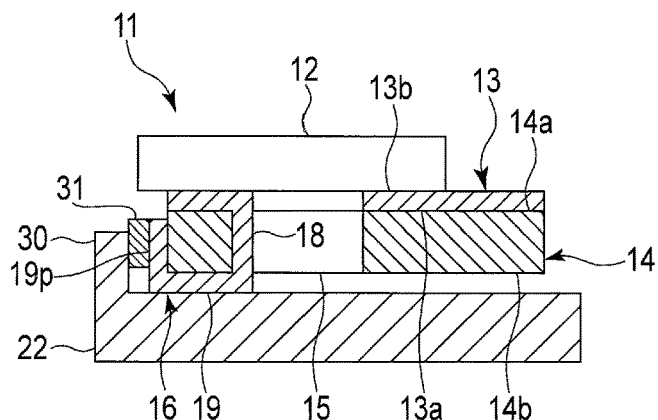
F I G. 9
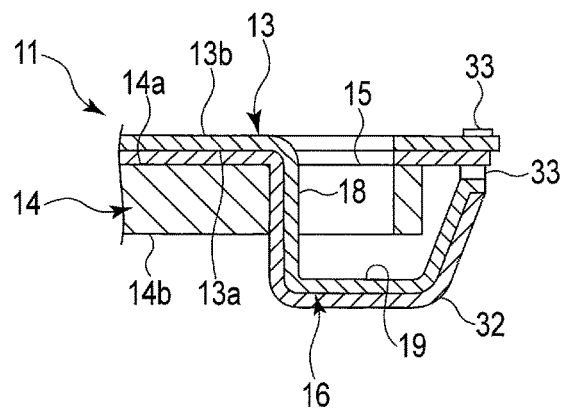
F I G. 10

FLEXIBLE PRINTED CIRCUIT AND ELECTRONIC APPARATUS

CROSS-REFERENCE TO RELATED APPLICATIONS

This application claims the benefit of U.S. Provisional Application No. 62/296,003, filed Feb. 16, 2016, the entire contents of which are incorporated herein by reference.

FIELD

Embodiments described herein relate generally to a flexible printed circuit and an electronic apparatus.

BACKGROUND

In electronic apparatuses, for example, feature phones, smartphones, and computers, flexible printed circuits (hereinafter, referred to as FPCs) on which electronic components can be mounted have been used to achieve compactness and weight reduction. As the electronic components, for example, semiconductor chips and connectors can be assumed.

Regarding the FPCs, it has been requested that the electronic components be mounted at high density with flexibility maintained (high-density packaging), and the degree of freedom of circuit design be improved (circuit design liberalization).

Incidentally, in the FPCs, reinforcing plates are provided at portions, the mechanical strength of which needs to be increased. In conventional FPCs, it has been impossible to mount electronic components on the portions at which the reinforcing plates are provided. Thus, there has been a certain limit on the high-density packaging and the circuit design liberalization.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 8 is an exemplary sectional view along line F8-F8 of FIG. 7.

FIG. 9 is an exemplary sectional view of an FPC according to a fourth embodiment.

FIG. 10 is an exemplary sectional view of an FPC according to a fifth embodiment.

DETAILED DESCRIPTION

Various embodiments will be described hereinafter with reference to the accompanying drawings. In general, according to one embodiment, a flexible printed circuit (that is, an FPC) comprises a flexible board body, a reinforcing plate, an opening portion, and a bent structure. The opening portion is formed to penetrate through the board body. The bent structure is bent to pass through the inside of the opening portion.

Electronic Apparatus According to One of Embodiments

Figure 1:
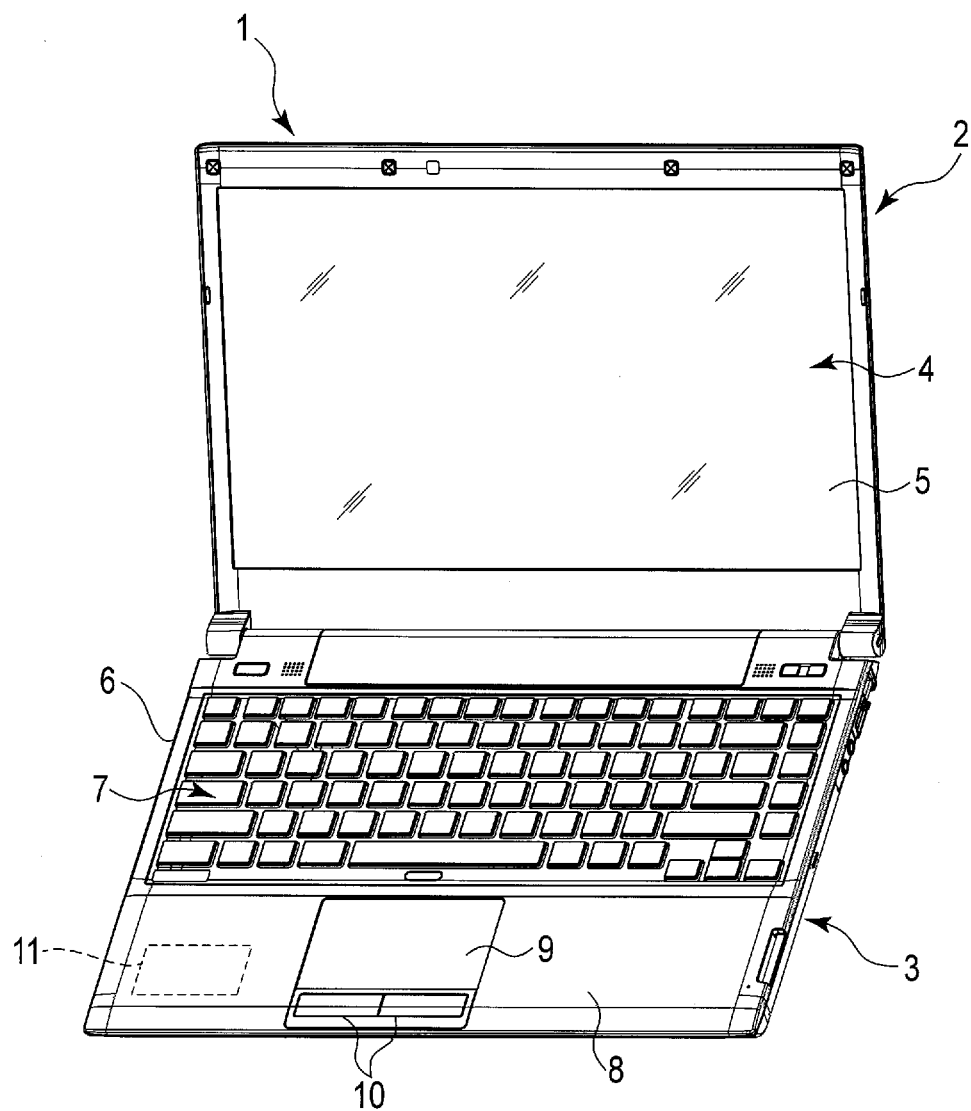
FIG. 1 is an exemplary perspective view showing an outside of an electronic apparatus according to one of the embodiments.

As electronic apparatuses of the present embodiments, for example, feature phones, smartphones, and computers can be assumed. FIG. 1 shows a notebook portable computer 1 as an example of an electronic apparatus in which an FPC 11, described later, is incorporated. The computer 1 comprises a display unit 2 and a main unit 3.

The display unit 2 has the shape of an even (flat) box. In the display unit 2, a display module 4 is incorporated. The figure shows a liquid crystal display as an example of the display module 4. The liquid crystal display is provided with a screen 5 on which, for example, images (still images and moving images) and characters, can be displayed.

The main unit 3 comprises a housing 6 having the shape of an even (flat) box. The housing 6 is provided with, for example, a keyboard 7, a palm rest 8, a touchpad 9, and a pair of buttons 10. The above-described display unit 2 is attached to the main unit 3 to be openable and closable. FIG. 1 shows an open state of the display unit 2. In the open state, a user can operate the keyboard 7, for example, while viewing the screen 5 of the liquid crystal display.

Figure 2:
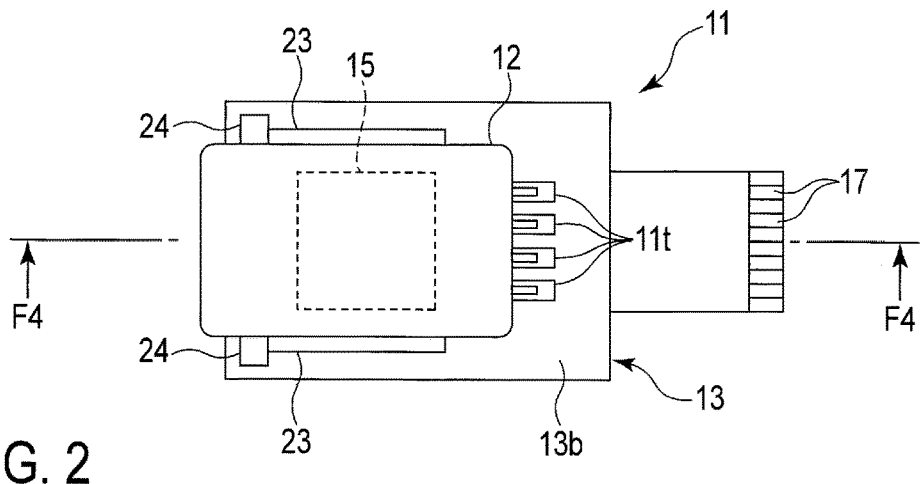
FIG. 2 is an exemplary plan view of an FPC according to a first embodiment.

In the housing 6, various kinds of machine component and electronic component (both of which are not shown in the figure) and the FPC 11 are accommodated. On the FPC 11, machine components and electronic components can be mounted. FIG. 2 shows a card connector 12 as an example of an electronic component. In the card connector 12, an SD memory card (not shown in the figure) is removably inserted. The card connector 12 is electrically connected to the FPC 11 via a connection terminal 11*t*.

FPC 11 According to First Embodiment

Figure 3:
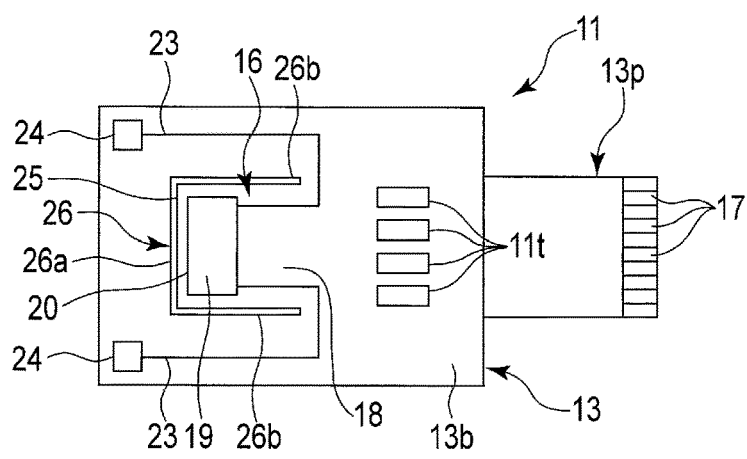
FIG. 3 is an exemplary plan view showing a method of forming a bent structure of the FPC of FIG. 2.
Figure 4:
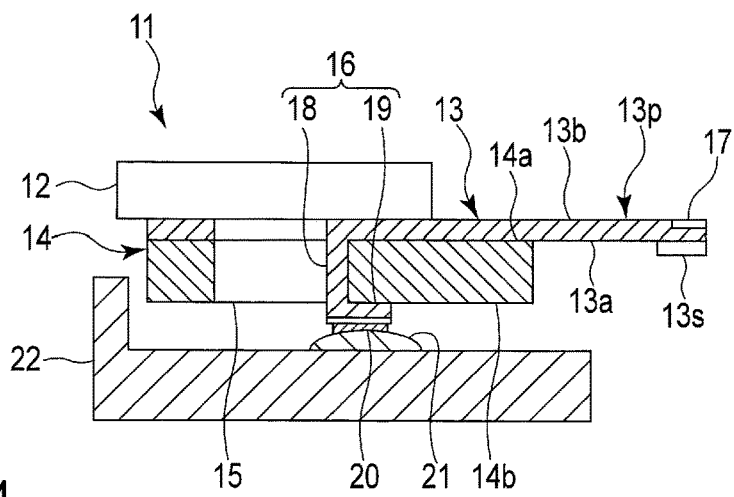
FIG. 4 is an exemplary sectional view along line F4-F4 of FIG. 2.

As show in FIG. 2 to FIG. 4, an FPC 11 of the present embodiment comprises a flexible board body 13, a reinforcing plate 14, an opening portion 15, and a bent structure 16.

As the FPC 11, for example, a single-sided FPC, a double-sided FPC, or a multilayered FPC, which is not particularly shown in the figures, can be applied. In the single-sided FPC, a circuit (conductor pattern) is formed on only one side of a base film. In the double-sided FPC, circuits (conductor patterns) are formed on both sides of a base film. Further, in the multilayered FPC, a circuit (conductor pattern) is formed between base films.

The board body 13 is formed by attaching copper foil to a flexible thin film, which is not particularly shown in the figures. As a material of the film, for example, resin such as polyimide or polyester can be applied. In this structure, the above-described circuits (conductive patterns) can be formed along the board body 13 by, for example, chemically etching the copper film.

The board body 13 is provided with a connector portion 13p. On an end edge of the connector portion 13p, a connector terminal 17 and a reinforcing element 13s are mounted. The connector terminal 17 is held by the reinforcing element 13s. The connector terminal 17 thereby can be detachably connected to, for example, a socket mounted on another board, which is not particularly shown in the figures.

Moreover, the board body 13 comprises two body surfaces (for example, a first body surface 13a and a second body surface 13b). The two body surfaces (first body surface 13a and second body surface 13b) are parallel to and face each other.

In addition, the reinforcing plate 14 comprises two reinforcing surfaces (for example, a first reinforcing surface 14a and a second reinforcing surface 14b). The two reinforcing surfaces (first reinforcing surface 14a and second reinforcing surface 14b) are parallel to and face each other. In this case, the reinforcing plate 14 is mounted on the board body 13 to bring one reinforcing surface (first reinforcing surface 14a) into contact with one body surface (first body surface 13a).

The reinforcing plate 14 is provided at a portion, the mechanical strength of which needs to be increased, of the FPC 11 (board body 13). Thus, the reinforcing plate 14 is formed of a highly rigid material. As the material, for example, glass epoxy resin, polyimide resin, stainless steel, or aluminum can be applied.

Moreover, the reinforcing plate 14 is provided with the opening portion 15. The opening portion 15 is formed to penetrate through the two reinforcing surfaces (first reinforcing surface 14a and second reinforcing surface 14b). The opening portion 15 is provided at a portion facing the bent structure 16, which will be described later. The sectional shape of the opening portion 15 is set in accordance with the outline shape of the bent structure 16. In other words, the shape and the size of the opening portion 15 are set in such a way that the bent structure 16 can be bent. For example, as the sectional shape of the opening portion 15, various shapes such as a rectangle, a triangle, a circle, an ellipse, and an arc can be applied.

On the other hand, the board body 13 is provided with the above-described bent structure 16. The bent structure 16 is provided at the above-described portion facing the opening portion 15. The outline shape of the bent structure 16 is set in accordance with the sectional shape of the opening portion 15. In other words, the shape and the size of the bent structure 16 are set in such a way that that bent structure 16 can extend in the shape of a cantilever toward the opening portion and be bent to pass through the inside of the opening portion 15. For example, as the outline shape of the bent structure 16, various shapes such as a rectangle, a triangle, a circle, an ellipse, and an arc can be applied.

Moreover, the bent structure 16 is bent from the inside of the opening portion 15 to the other reinforcing surface (second reinforcing surface 14b) of the reinforcing plate 14. The bent structure 16 comprises a first bent portion 18 and a second bent portion 19. The first bent portion 18 is bent to pass through the inside of the opening portion 15. The second bent portion 19 is continuous with the first bent portion 18. The second bent portion 19 is bent along the other reinforcing surface (second reinforcing surface 14b) of the reinforcing plate 14.

Here, a mounting region where machine components and electronic components are mounted can be set on the second bent portion 19. In addition, the above-described two body surfaces (first body surface 13a and second body surface 13b) are formed to be continuous with the bent structure 16.

That is, as described above, the bent structure 16 extends in the shape of a cantilever toward the opening portion 15. In this state, the one body surface (first body surface 13a) is continuous with the portion facing the opening portion 15. In addition, the other body surface (second body surface 13b) is continuous with the opposite side (counter-opening-portion side) to the opening portion 15.

According to the above-described structure, in a state in which the second bent portion 19 is bent along the other reinforcing surface (second reinforcing surface 14b) of the reinforcing plate 14, the other body surface (second body surface 13b) is exposed outside above the other reinforcing surface (second reinforcing surface 14b). In this case, the mounting region can be set on the other body surface (second body surface 13b), which is exposed outside, of the second bent portion 19.

In the present embodiment, a ground terminal 20 as an electronic component is mounted in advance in the mounting region (second bent portion 19). In FIG. 4, as an example, the ground terminal 20 is connected to a base 22 via a gasket 21. The base 22 is set at, for example, a reference potential. The gasket 21 is not essential, and the ground terminal 20 may be directly connected to the base 22.

Moreover, a ground circuit 23 is connected to the ground terminal 20. The ground circuit 23 passes from the second bent portion 19 to the first bent portion 18, and is connected to electrical contacts 24. The electrical contacts 24 are formed on the other body surface (second body surface 13b) of the board body 13. The above-described card connector 12 is electrically connected to the electrical contacts 24.

The card connector 12 can be thereby connected to the reference potential via the ground terminal 20. In this case, the card connector 12 is kept at the reference potential at all times. As a result, it is possible to use the card connector 12 electrically stably.

Method of Forming Bent Structure

As shown in FIG. 3, a bent region 25 is set in, for example, a portion facing the reinforcing plate 14 of the board body 13. The bent region 25 can be set into an arbitrary shape in accordance with the purpose of using the FPC 11 or the environment in which the FPC 11 is used. As an example, the bent region 25, which is rectangular, is herein assumed. The bent region 25 forms an area including the above-described first bent portion 18 and second bent portion 19 (mounting region).

Next, a rectangular slit 26 is formed along the bent region 25. The slit 26 is formed to penetrate through the two body surfaces (first body surface 13a and second body surface 13b). The rectangular slit 26 comprises one front slit 26a and two side slits 26b. The side slits 26b are continuous with both sides of the front slit 26a. The two side slits 26b have a positional relationship in which they are orthogonal to the front slit 26a. The two side slits 26b are parallel to and face each other. In this manner, the bent structure 16 extending in the shape of a cantilever toward the opening portion 15 is formed.

As shown in FIG. 4, the bent structure 16 is herein bent toward the inside of the opening portion 15. The first bent portion 18 is thereby formed. Moreover, the bent structure 16 is bent to extend to the other reinforcing surface (second reinforcing surface 14b) of the reinforcing plate 14. The second bent portion 19 is thereby formed. As a result, the other body surface (second body surface 13b) as a mounting region is positioned to be exposed outside above the other reinforcing surface (second reinforcing surface 14b).

Advantages of Present Embodiment

According to the present embodiment, a new electronic component can be mounted on a portion where an electronic component could not be mounted in a conventional FPC (that is, a portion where the reinforcing plate 14 is provided). As a result, the FPC 11, which is excellent in the high-density packaging and the circuit design liberalization, can be achieved.

According to the present embodiment, the bent structure 16 is bent to extend from the inside of the opening portion 15 to the other reinforcing surface (second reinforcing surface 14b) of the reinforcing plate 14. This alone enables mounting regions to be set on both sides of the one reinforcing plate 14. As a result, electronic components can be mounted at high density without newly adding a structure for mounting.

According to the present embodiment, the slit 26 is formed in the board body 13, and the opening portion 15 is formed in the reinforcing plate 14. This alone enables the FPC 11, both sides of which can be used for mounting, to be formed. In other words, the FPC 11, which is double-sided, can be achieved by using an existent FPC as it is and without increasing the number of components. As a result, the double-sided FPC 11, which is low-cost and compact, can be achieved.

Moreover, to connect an electronic component to a reference potential, it has been conventionally necessary to prepare a component for connecting the electronic component to the reference potential (for example, ground aluminum tape) separately, which is not particularly shown in the figures. The aluminum tape is disposed via the outside of an FPC. Thus, the width dimension of the FPC has been increased, and it has been impossible to satisfy a request for compactness. Moreover, the number of components has been increased, and it has been impossible to satisfy a request for reduction in cost.

In contrast, according to the present embodiment, the ground aluminum tape is unnecessary as is clear from the above-described advantages. As a result, the double-sided FPC 11, which is low-cost and compact, can be achieved.

FPC 11 According to Second Embodiment

Figure 5:
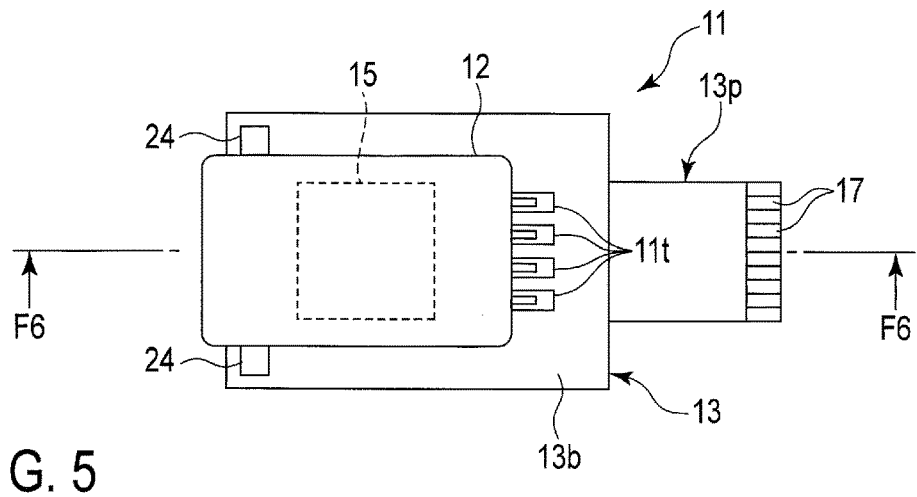
FIG. 5 is an exemplary plan view of an FPC according to a second embodiment.
Figure 6:
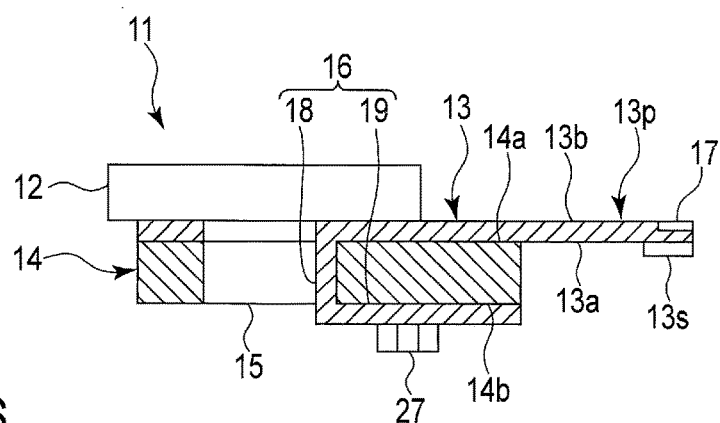
FIG. 6 is an exemplary sectional view along line F6-F6 of FIG. 5.

As shown in FIG. 5 and FIG. 6, in an FPC 11 of the present embodiment, a second bent portion 19 is formed to extend to an end edge of the other reinforcing surface (second reinforcing surface 14b) of a reinforcing plate 14. A mounting region is thereby set relatively wide. Thus, the mounting region can be used as an area for mounting other electronic components. In FIG. 6, as an example, a semiconductor chip 27 is mounted in the mounting region. The other structures and advantages are the same as those of the above-described first embodiment, and thus, description thereof is omitted.

FPC 11 According to Third Embodiment

Figure 7:
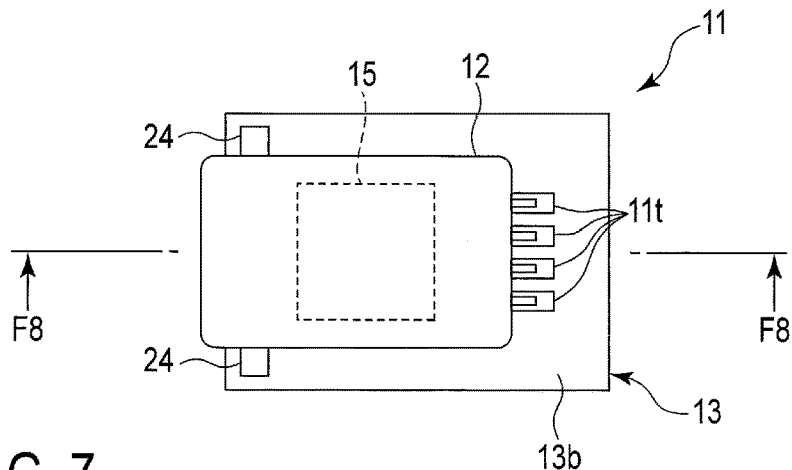
FIG. 7 is an exemplary plan view of an FPC according to a third embodiment.

As shown in FIG. 7 and FIG. 8, in an FPC 11 according to the present embodiment, a mounting region which can connect to other electronic components is formed in a second bent portion 19. In the mounting region, a connector terminal 17, described above, is mounted at an end edge of the second bent portion 19. The connector terminal 17 can be detachably connected to, for example, a socket 29 mounted on another board 28. The other structures and advantages are the same as those of the above-described first embodiment, and thus, description thereof is omitted.

FPC 11 According to Fourth Embodiment

As shown in FIG. 9, in an FPC 11 according to the present embodiment, a mounting region which can be fixed to a fixing wall 30 is formed in a second bent portion 19. The fixing wall 30 rises from, for example, a base 22, described above. The mounting region is formed by bending a tip portion 19p of the second bent portion 19 along a reinforcing plate 14. In this structure, the mounting region (tip portion 19p of the second bent portion 19) is parallel to and faces the fixing wall 30. In the mounting region, a holder 31 as a machine component for fixing is mounted. In this case, the holder 31 is brought into contact with the fixing wall 30. The FPC 11 thereby can be fixed to the base 22. The other structures and advantages are the same as those of the above-described first embodiment, and thus, description thereof is omitted.

FPC 11 According to Fifth Embodiment

Conventionally, as an existent process whereby an FPC is given a shield function, for example, a connection hole has been formed in advance in the FPC, and then, silver paste has been poured into the connection hole, which is not particularly shown in the figures.

In contrast, as shown in FIG. 10, in an FPC 11 according to the present embodiment, a shield layer 32 is formed on one body surface (first body surface 13a) of a board body 13. The shield layer 32 is provided with silver paste. Moreover, a mounting region which can connect to a conductor 33 is formed in a second bent portion 19. The conductor 33 is provided on the one body surface (first body surface 13a) of the board body 13.

In this case, the second bent portion 19 extends to cross an opening portion 15. Moreover, the second bent portion 19 extends over a reinforcing plate 14 toward the conductor 33. In addition, the conductor 33 is connected to an end edge of the second bent portion 19. The FPC 11, which has a shield structure, can be thereby achieved without forming the above-described connection hole. The other structures and advantages are the same as those of the above-described first embodiment, and thus, description thereof is omitted.

FPC 11 According to Sixth Embodiment

Figure 11:
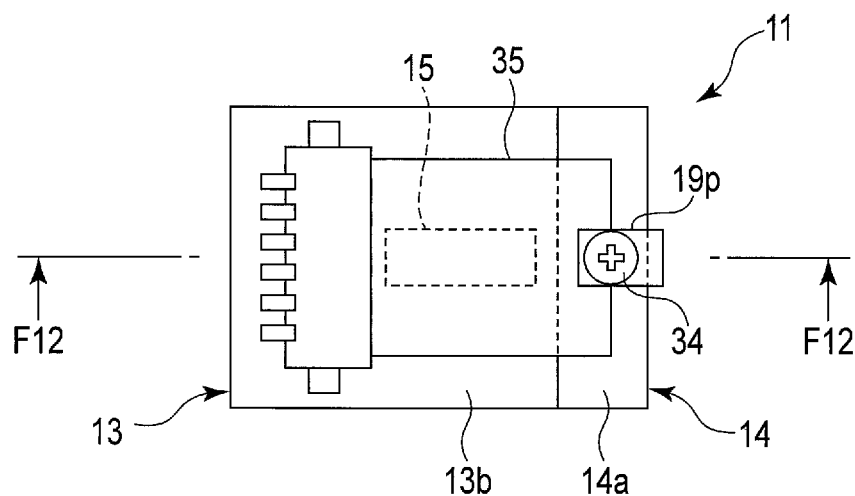
FIG. 11 is an exemplary plan view of an FPC according to a sixth embodiment.
Figure 12:
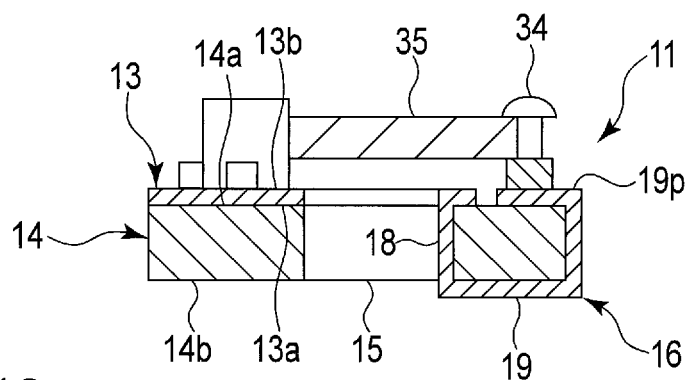
FIG. 12 is an exemplary sectional view along line F12-F12 of FIG. 11.

As shown in FIG. 11 and FIG. 12, in an FPC 11 according to the present embodiment, a mounting region where machine components can be mounted is formed in a second bent portion 19. The mounting region is formed by bending a tip portion 19p of the second bent portion 19 along a reinforcing plate 14. In this structure, the mounting region (tip portion 19p of the second bent portion 19) extends along one reinforcing surface (first reinforcing surface 14a) of the reinforcing plate 14. In the mounting region, a stud 34 is mounted as a machine component. The stud 34 is formed in such a way that it can fix the FPC 11 to the reinforcing plate 14 and support one end of an electric component 35 mounted on the FPC 11.

In this case, the second bent portion 19 is extended to the one reinforcing surface (first reinforcing surface 14a) of the reinforcing plate 14, whereby a board body 13 (circuit or conductive pattern) can be formed minimally. The manufacturing cost of the FPC 11 can be thereby greatly reduced. The other structures and advantages are the same as those of the above-described first embodiment, and thus, description thereof is omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible printed circuit comprising:
    a flexible board body comprising a first body surface on which an electronic component is mounted, a second body surface on an opposite side of the first body surface, and a first opening portion;
    a reinforcing plate configured to reinforce the first opening portion, the reinforcing plate comprising a first reinforcing surface in contact with the second body surface of the board body, a second reinforcing surface on an opposite side of the first reinforcing surface, and a second opening portion opposed to the first opening portion; and
    a bent structure formed in the first opening portion of the board body, the bent structure being bent to the second reinforcing surface from the first reinforcing surface of the reinforcing plate passing through an inside of the second opening portion,
    wherein the bent structure comprises a first bent portion in contact with the second opening portion and a second bent portion in contact with the second reinforcing surface.

2. The flexible printed circuit of claim 1, wherein
    the electronic component is provided above the first opening portion and the second opening portion, and
    the second bent portion of the bent structure is connected to a ground terminal of a base.

3. The flexible printed circuit of claim 1, wherein a mounting region where the electronic component is mounted is settable in the second bent portion.

4. The flexible printed circuit of claim 1, wherein
    a connector terminal connectable with a socket mounted on an external substrate is formed on an edge of the bent structure.

5. The flexible printed circuit of claim 1, wherein a tip portion of the second bent portion of the bent structure is exposed outside, and the tip portion is fixed to a fixing wall of a base.

6. An electronic apparatus comprising:
    a housing; and
    a flexible printed circuit accommodated in the housing, wherein the flexible printed circuit comprises:
        a flexible board body comprising a first body surface on which an electronic component is mounted, a second body surface on an opposite side of the first body surface, and a first opening portion;
        a reinforcing plate configured to reinforce the first opening portion, the reinforcing plate comprising a first reinforcing surface in contact with the second body surface of the board body, a second reinforcing surface on an opposite side of the first reinforcing surface, and a second opening portion opposed to the first opening portion; and
        a bent structure formed in the first opening portion of the flexible board body, the bent structure being bent to the second reinforcing surface from the first reinforcing surface of the reinforcing plate passing through an inside of the second opening portion,
        wherein the bent structure comprises a first bent portion in contact with the second opening portion and a second bent portion in contact with the second reinforcing surface.

7. The electronic apparatus of claim 6, wherein
    the electronic component is provided above the first opening portion and the second opening portion, and
    the second bent portion of the bent structure is connected to a ground terminal of a base.

8. The electronic apparatus of claim 6, wherein a mounting region where the electronic component is mounted is settable in the second bent portion.

9. The electronic apparatus of claim 6, wherein
    a connector terminal connectable with a socket mounted on an external substrate is formed on an edge of the bent structure.

10. The electronic apparatus of claim 6, wherein a tip portion of the second bent portion of the bent structure is exposed outside, and the tip portion is fixed to a fixing wall of a base.

* * * * *